United States Patent [19]

Gajjar

[11] Patent Number: 4,648,091
[45] Date of Patent: Mar. 3, 1987

[54] APPARATUS AND METHOD FOR DECODING ERROR CORRECTION CODED INFORMATION

[75] Inventor: Jagdish T. Gajjar, Clifton Park, N.Y.

[73] Assignee: General Electric Company, Schenectady, N.Y.

[21] Appl. No.: 627,368

[22] Filed: Jul. 2, 1984

[51] Int. Cl.[4] ............................................. G06F 11/10
[52] U.S. Cl. ........................................ 371/37; 371/39
[58] Field of Search ...................... 371/39, 38, 37, 40, 371/41

[56] References Cited

U.S. PATENT DOCUMENTS 4,397,022  8/1983  Weng ..................................... 371/37
4,414,667  11/1983  Bennett ................................. 371/37

Primary Examiner—Michael R. Fleming
Attorney, Agent, or Firm—Bernard J. Lacomis; James C. Davis, Jr.

[57] ABSTRACT

A method for decoding error correction coded information having been encoded using a linear cyclic block code, such as a Golay (23,12) code, or an extended Golay (24,12) code, to form a message word, comprises serially examining each bit of the message word and forming another code word wherein the Hamming distance between the other code word and the sequential pattern of bits examined is not greater than the error correction capability of the message word. Apparatus for forming the other code word and for checking Hamming distances is described.

16 Claims, 2 Drawing Figures

APPARATUS AND METHOD FOR DECODING ERROR CORRECTION CODED INFORMATION

BACKGROUND OF THE INVENTION

This invention relates to decoding information and more specifically to a method and apparatus for decoding information encoded using a linear cyclic block error correction code.

Linear codes form a linear vector space and include the property that two code words can be added using a suitable definition for addition to produce a third code word. In the case of a binary code, the operation is symbol-by-symbol modulo-2 addition of the code words, i.e. $1+1=0, 1+0=1, 0+1=1, 0+0=0$. A code is a cyclic code if every cyclic shift of a code word generates another code word. An example of a linear cyclic block code is a Golay (23,12) code, i.e. $n=23$ bits long including $k=12$ data bits and $(n-k)=11$ redundancy bits.

Reliability and integrity of data communication over noisy and marginal (i.e. low signal-to-noise ratio) channels may be improved through use of error correction coding. Typically a parity word is attached to or concatenated with a data word to form a message or code word which is then transmitted. Conventional methods and apparatus for decoding code words, including linear cyclic block codes, are described in "Error-Correction Coding for Digital Communications" by George C. Clark, Jr. and J. Bibb Cain (1981) (hereinafter Clark and Cain) and "Error Control Coding: Fundamentals and Applications" by Shu Lin and Daniel J. Costello, Jr. (1983) (hereinafter Lin and Costello). These methods generally employ error trapping and/or algorithmic syndrome generation and begin decoding after the entire message word has been received. They are generally complex and expensive to implement since the entire decoding cycle must be repeated for each message word received. A maximum time interval or limit for completion of decoding may be imposed by overall system operating performance requirements and, in order to satisfy time constraints, expensive hardware decoder implementations may be required, especially for systems using bit serial transmission of the message word.

Accordingly it is an object of the present invention to provide a method and apparatus for reducing the time required for decoding linear cyclic block codes.

Another object of the present invention is to eliminate the need of expensive hardware for decoding linear cyclic block codes.

Still another object is to begin decoding a partially received string of information bits of a message word before the entire message word is received.

BRIEF SUMMARY OF THE INVENTION

In accordance with the present invention, a method of decoding a data word from a binary message word, the binary message word having been encoded to form a first linear cyclic block code word including the data word and a parity word comprises serially examining each respective bit of the first linear cyclic block code word and forming a second linear block code word, the second linear cyclic block code word having the same order as the first linear cyclic block code word, after examination of each respective bit of the first linear cyclic block code word, wherein the Hamming distance between the second linear cyclic block code word and the serial pattern of the respective bits already examined is not greater than the maximum error correction capability of the first linear cyclic block code word. After all bits of the first linear cyclic code word have been processed, the second linear cyclic block code word represents a decoded first linear cyclic block code word, within the error correction capability of the system. A decoded message word may be extracted from the decoded second linear cyclic block code word.

Apparatus for forming the second linear block code word, examining each respective bit of the first linear block code word and determining Hamming distances comprises a read only memory, a bit counter, a microprocessor and appropriate registers.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

DETAILED DESCRIPTION

Figure 1:
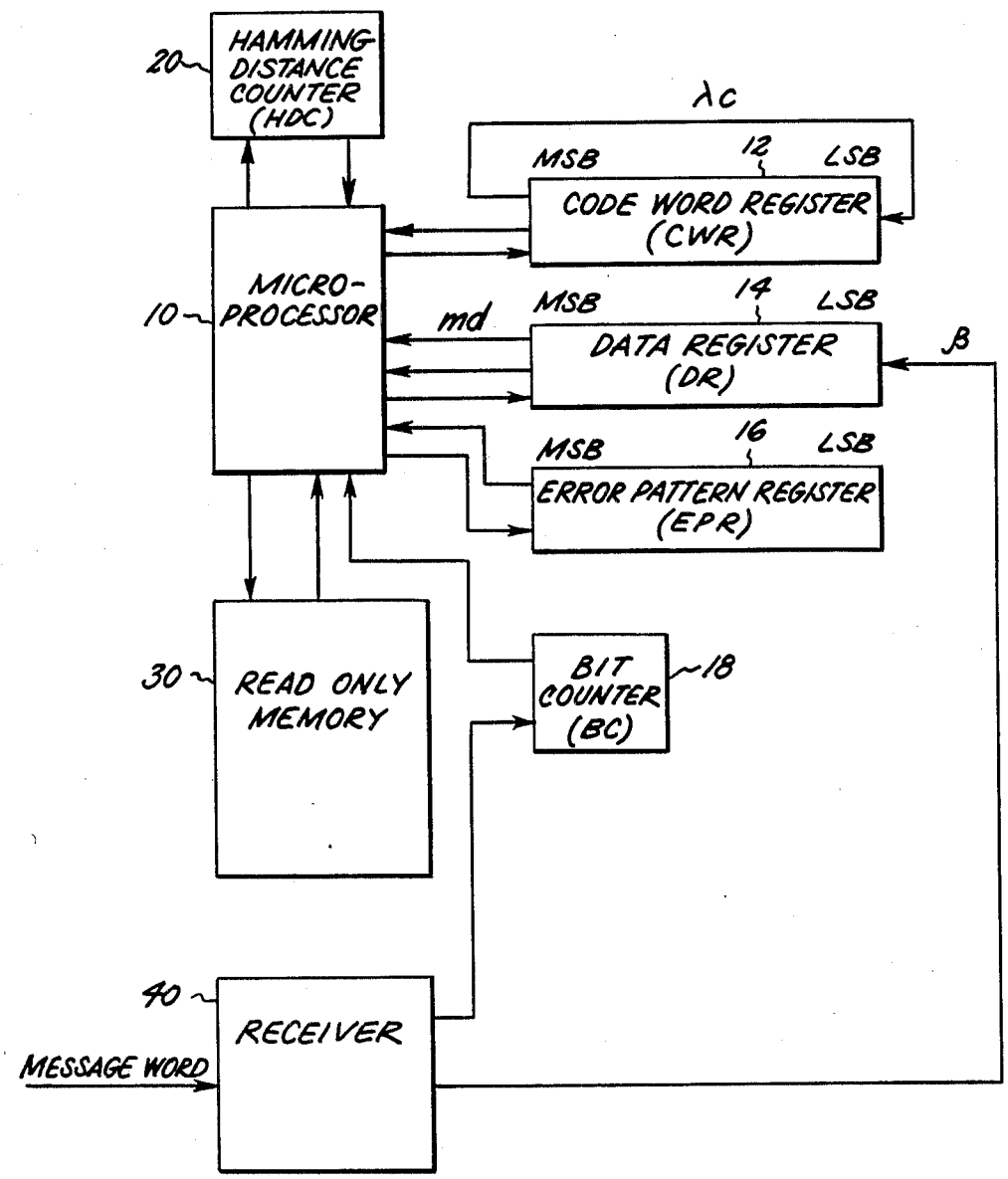
FIG. 1 is a block diagram of apparatus useful with the present invention.

Reliability of communication over noisy and low signal-to-noise ratio channels is often improved by use of error correction coding. When communication comprises messages of defined structure, such as intra- and inter-computer communication, and power line carrier communication, it is desirable to use linear cyclic block codes for encoding messages. Additionally, interleaving transmission of messages may be undertaken in order to combat burst noise errors.

The basic Golay (23,12) code words are members of a set of binary code words which are linear cyclic block words. The block length of a Golay (23,12) code word is 23 bits. Since Golay (23,12) code words are linear, the modulo-2 sum of two code words produces a code word. A cyclic shift in a code word also results in a code word. A Golay (23,12) code is also a perfect code. The maximum bit error correction capability of a Golay (23,12) is three. Thus every 23 bit pattern of logical ones and zeroes is within three errors (Hamming distance=3) of a unique 23 bit code word. As a consequence, the Golay (23,12) code is a triple error correcting code. The minimum Hamming distance between any two Golay (23,12) code words is seven. Hamming distance is the total number of bit positions in which two code words contain different logical values when the code words are compared for each respective corresponding bit position. Comparison for a binary code word may be effected by modulo-2 subtraction or exclusively ORing the two code words and summing the number of logical ones in the remainder or result, respectively. Since they are also perfect codes, Golay (23,12) code words utilize the n-space in an efficient manner. They offer an optimal combination of code word separation and code rate, among linear cyclic codes.

The extended Golay code (24,12) is an exactly half rate code useful for implementing coded automatic repeat request (ARQ) schemes. These schemes are useful in communication systems wherein communications occur in a master-slave arrangement and electrical paths between master and slaves are of independently randomly varying quality, exemplified by a distribution- or power-line communication system and a communication system in a factory environment. Extended Golay code (24, 12) uses a 24 bit code word, including 12 data bits and 12 parity bits, as a basic block. It is capable of correcting up to 3 bits in error and detecting an additional one bit in errors. When implemented as a sequential single-bit interleaved code, a single burst of bits of up to three times the number of words interleaved can be corrected.

A Golay (23,12) code word can be generated from a 12 bit data word in the following manner. Using one of the following generator polynomials:

$$g_1(x)=x^{11}+x^9+x^7+x^6+x^5+x+1$$

or $$g_2(x)=x^{11}+x^{10}+x^6+x^5+x^4+x^2+1,$$

the (23,12) bit basic Golay code word is generated. This process can be accomplished using shift register encoding or modulo-2 arithmetic. The feedback shift register method is usually used for high speed data generation. For low data rates, such as those typically used in distribution line communications, the modulo-2 arithmetic method is preferable. In this method, parity bits are generated by performing a modulo-2 division of the word obtained by appending 11 logical zeroes to the end of 12 data bits. The 11 bits in the remainder are the parity bits. The code word is obtained by appending these eleven parity bits to the 12 data bits. The extended Golay (24,12) code word is obtained by appending an overall parity bit to the 23 bit basic Golay (23,12) code word and can be easily implemented using a microprocessor. Apparatus and methods for encoding using a Golay (23,12) code are described in the aforementioned references Lin and Costello (Chapter 5), and Clark and Cain (Chapter 2). A Golay (24,12) code word may be generated from a Golay (23,12) code word by adding an overall parity bit, typically even. The minimum Hamming distance between two Golay (24,12) code words is eight. Thus a Golay (24,12) code word is a triple error correcting and quadruple error detecting code word. A Golay (24,12) code word is neither cyclic nor linear.

Typical known decoding techniques use feedback shift registers to generate syndromes (see Clark and Cain, section 2.2.7; Lin and Costello, chapter 3). A syndrome is the remainder obtained by dividing the received message word (which may be considered as the sum (modulo-2) of the transmitted code word vector and an error vector introduced after the data word was encoded) by the generator polynominal used to encode the data word. Counting circuitry is typically used to determine the weights (i.e. number of logical ones) of syndromes. The weights serve as an indication as to whether a particular syndrome is an error-trap, and thus can be used to identify bits in error. Up to 23 cyclic shifts followed by syndrome computation and weight counting may be needed to decode one received vector or word of 23 bits. For use in message synchronization, this procedure must be done for every bit received.

Syndrome generation by simulating feedback registers or by modulo-2 division and remaindering is not particularly suited for implementation in a microprocessor. Also determination of weights by counting the number of ones is very time consuming when implemented in a microprocessor. As a consequence, many decoders employ hardware feedback shift registers in conjunction with a microprocessor for decoding. Shift registers generate syndromes and the microprocessor is used for weight counting.

The basic Golay (23,12) code words are the only known possible binary perfect code words with multiple-error correction capability. In addition they have some interesting and useful properties. The basic Golay (23,12) code is structured such that every code word has exactly 253 code words which are at Hamming distance of seven from it. (Seven is also the minimum distance to correct three errors. See Clark and Cain, Section 1.1). The set of Golay (23,12) code words obtained by modulo-2 addition of a code word and its 253 closest code word neighbors consists of cyclic shifts of 11 patterns, each of which contains exactly seven logical ones. Of this latter set of 253 code words, exactly 77 are such that they have a logical one in the least significant position.

A very important property of the Golay (23,12) code follows. Consider 23 bit strings which have exactly four ones, with the least significant bit occupied by one of the four logical ones. Four logical ones are chosen since four is one more than the maximum error correction capability of a Golay (23,12) code and further since in the system of the invention it is possible to generate an error word with four logical ones by combining a known code word and a data word which is known to be a Hamming distance of 4 from the known code word. Combinatorial based calculations show that the number of these strings is $(22\times21\times20)/(1\times2\times3)$, i.e. 1540. For any one of the previously described 77 patterns of a Golay (23,12) code word (i.e. seven ones with one logical one in least significant position), the number of different patterns which have exactly four logical ones in them, with one of the logical ones in the least significant position, is $(6\times5\times4)/6$, i.e. 20 different patterns. By starting with 77 patterns, and obtaining 20 different patterns of four for each of these, there are exactly 1540 combinations which satisfy the conditions. Thus, there must be a unique member of the set of 77 patterns (associated with every 23 bit string) having four logical ones such that one of the four logical ones is in the least significant position. In other words, in a 23 bit string which has exactly four logical ones, including a logical one in the least significant position, there is only one member of the 77 patterns which has a logical one in each position where the 23 bit string has a logical one. In accordance with the present invention, applicant has recognized that this last property of a Golay (23,12) code enables construction of an efficient tracking decoder for data having been encoded using a Golay (23,12) code.

A tracking decoder according to the present invention comprises a byte oriented decoder which is suitable for microprocessor implementation and facilitates decoding of interleaved bit strings at every bit time, so that the tracking decoder can be used for message synchronization in noisy channels by using pseudo-random synchronization message sequences.

The tracking decoder of the present invention is based upon a property of cyclic codes that a code word corresponding to a cyclic shift in a correctable bit pattern or word (i.e. a word having n or fewer errors, where n is the number of errors correctable by the code, e.g. n=3 for Golay (23,12) code) is the same cyclic shift of the code word corresponding to the original pattern. Also, the corresponding error pattern, i.e. difference pattern between the correctable pattern and the corresponding code word, undergoes a corresponding cyclic shift.

Referring to FIG. 1, a block diagram of apparatus of a tracking decoder in accordance with the present invention is shown. The tracking decoder comprises a microprocessor 10, a Hamming distance counter (HDC) 20, a read only memory (ROM) 30 and a receiver 40, having an input adapted to receive a message word. Receiver 40 may comprise any appropriate serial modem. HDC 20 and ROM 30 include a respective input and output coupled to a respective output and input of microprocessor 10, respectively. Microprocessor 30 may comprise a type 8051 microprocessor manufactured by Intel, or the like. A type 8051 includes a random access memory (RAM), but if the microprocessor used does not include a RAM then an appropriate one may be provided as is known in the art. The tracking decoder further comprises a code word register (CWR) 12, a data register (DR) 14, an error pattern or scratch pad register (EPR) 16 and a bit counter (BC) 18. CWR 12, DR 14 and EPR 16 each include an input and an output coupled to respective outputs and inputs of microprocessor 10, respectively. CWR 12, DR 14 and EPR 16 are each long enough to accommodate an entire code word, e.g. 23 bits long for a Golay (23,12) code word. They each may be 23 bits long for an extended Golay (24,12) code word as hereinafter described. CWR 12, DR 14 and EPR 16 may alternately comprise a RAM, coordinated by microprocessor 10. Alternatively, the tracking decoder may comprise a type 8049 single chip microprocessor manufactured by Intel, or the like, in which case CWR 12, DR 14 and EPR 16 may comprise registers which are an integral part of the chip. BC 18 includes an input coupled to an output of receiver 40 for accepting the message word as received, for counting the number of bits received and an output coupled to an input of microprocessor 10 for supplying the number of bits of the message word which have been received. Another output of receiver 40 is coupled to an input of DR 14 for supplying the received message word thereto. Also available at an output of DR 14 is the value md of the most significant bit (MSB) of DR 14, which is supplied to an input of microprocessor 10.

In operation, each bit of the received bit stream of the message word is sequentially shifted into DR 14, say from the right. For every bit received, DR 14 makes one left shift. A code word, initially zero, corresponding to the partially received bit pattern, is stored in CWR 12. CWR 12 performs a cyclic shift (i.e. bit at MSB position (λc) moves to LSB position and other bits all move one bit position toward MSB) upon receipt of each bit of the message word as determined by BC18. If the received bit has the same value as the bit dropping out of or exceeding bit position 23 from the LSB position of DR 14 (i.e. md), then the difference error bit pattern (modulo-2) between the contents of CWR 12 and DR 14 does not change in the number of errors, i.e. the Hamming distance between the new bit pattern in DR 14 and the contents of CWR 12 does not change, and the pattern in DR 14 is still a correctable pattern corresponding to the code word in CWR 12.

When the received bit is different from the bit dropping out of the DR 14 (i.e. md), the Hamming distance between the contents of DR 14 and contents of CWR 12 changes by one. If the received bit is the same as the bit cycling out of CWR 12 (i.e. λc), the Hamming distance between the new received bit pattern (i.e. contents of DR 14) and the new contents of CWR 12 decreases by one. With any decrease in Hamming distance, the bit pattern in DR 14 is still a bit pattern correctable to the code word in CWR 12. When the received bit and bit cycling out of CWR 12 are different, the Hamming distance increases by one. By keeping track of Hamming distances between the contents of DR 14 and contents of CWR 12, it is possible to determine when the bit pattern in DR 14 is no longer a correctable pattern (i.e. Hamming distance greater than 3 for a Golay (23,12) code) corresponding to the contents of CWR 12.

When the bit pattern in DR 14 is a sufficiently small distance away (i.e. Hamming distance greater than 3 for a Golay (23,12) code) from the contents of CWR 12 and can be judged to be a correctable pattern corresponding to another code word (i.e. Hamming distance less than or equal to 3 for a Golay (23,12) code), the contents of CWR 12 are updated so that the contents of CWR 12 correspond to the appropriate code word for the contents of DR 14. This updating may be accomplished by subtracting the contents of DR 14 from the contents of CWR 12 and decoding the remainder error pattern to the closest minimum weight, non-zero code word having a logical one in its least significant position. For a Golay (23,12) code, this process may be accomplished by comparing the remainder error pattern with the 77 unique or checking pattern code words having seven logical ones as previously described. A listing of the 77 unique patterns in hexadecimal representation is shown in Table I. Checking patterns may be conveniently assigned a unique index number and stored in ROM 30 for later recall when it is desired to perform a comparison.

TABLE I

CHECKING PATTERNS FOR TRACKING GOLAY (23,12) DECODER [HEXADECIMAL]

| C75 | 254B | 5E09 | 81B3 | A88D | 14585 | 1B301 |
|---|---|---|---|---|---|---|
| 1C843 | 21253 | 2402F | 26911 | 320E1 | 38419 | 41907 |
| 43039 | 46245 | 494C1 | 5028B | 60721 | 82691 | 88269 |
| 8D015 | 91423 | A1189 | B0A05 | C48A1 | D0151 | EA003 |
| 100BC1 | 107083 | 108607 | 11104D | 114231 | 129821 | 14C109 |
| 152C01 | 160095 | 18081B | 182125 | 1A4441 | 20031D | 202A23 |
| 205161 | 211891 | 223405 | 22C281 | 244413 | 258025 | 260849 |
| 2800C7 | 288D01 | 296009 | 3004A9 | 30A051 | 330103 | 3C1201 |
| 4012A5 | 4040D9 | 40E421 | 410929 | 412017 | 420C83 | 428145 |
| 448A11 | 475001 | 483841 | 484303 | 4C040D | 501511 | 522209 |
| 540063 | 598081 | 60900B | 610641 | 642181 | 6A0031 | 704805 |

Comparison comprises logically ANDing the remainder error pattern with each checking pattern of Table I and ascertaining whether the result is equal to the error pattern being logically ANDed. When the result is equal to the error pattern being logically ANDed, the new code word may be obtained by adding the respective error pattern being logically ANDed to the contents of CWR 12 and storing the result in CWR 12.

In this manner, the contents of CWR 12 track the received bit pattern of the message word and, for every additional bit received, represent the code word closest to the bit pattern actually received. After the entire message word has been received, CWR 12 contains the decoded code word, which includes the 12 bit data word and 11 bit parity word, corresponding to the received vector or code word.

When an extended Golay (24,12) code is used, the previously described decoding process for a Golay (23,12) code may be modified as follows. The first 23 bits are decoded by the procedure described above for a Golay (23,12) code. After decoding 23 bits, if the Hamming distance between the contents of CWR 12 and the contents of DR 14 is less than three, the 24th bit is ignored and the first twelve most significant bits of the contents of CWR 12 represent the decoded data word, within the error-correction capability of the decoder. If after decoding 23 bits, the Hamming distance between the contents of CWR 12 and the contents of DR 14 is exactly three, then upon receiving the 24th bit, the parity of all 24 received bits is checked. If parity agrees with the received parity (i.e. 24th) bit, the received message word has been decoded correctly within the error-correction capability of the decoder. If parity does not agree with the received parity (i.e. 24th) bit, there are more than three errors and a decoding error is identified. When code words are transmitted with an even parity, i.e. logical value of 24th bit makes total number of logical ones in 24 bit strings of message word even, this check may be simplified by keeping track of the parity of the received bit and the bits exiting from DR 14 during each bit shift operation. Checking parity of the entire 24 bit word then comprises checking coincidence of the individual parity checks.

Figure 2:
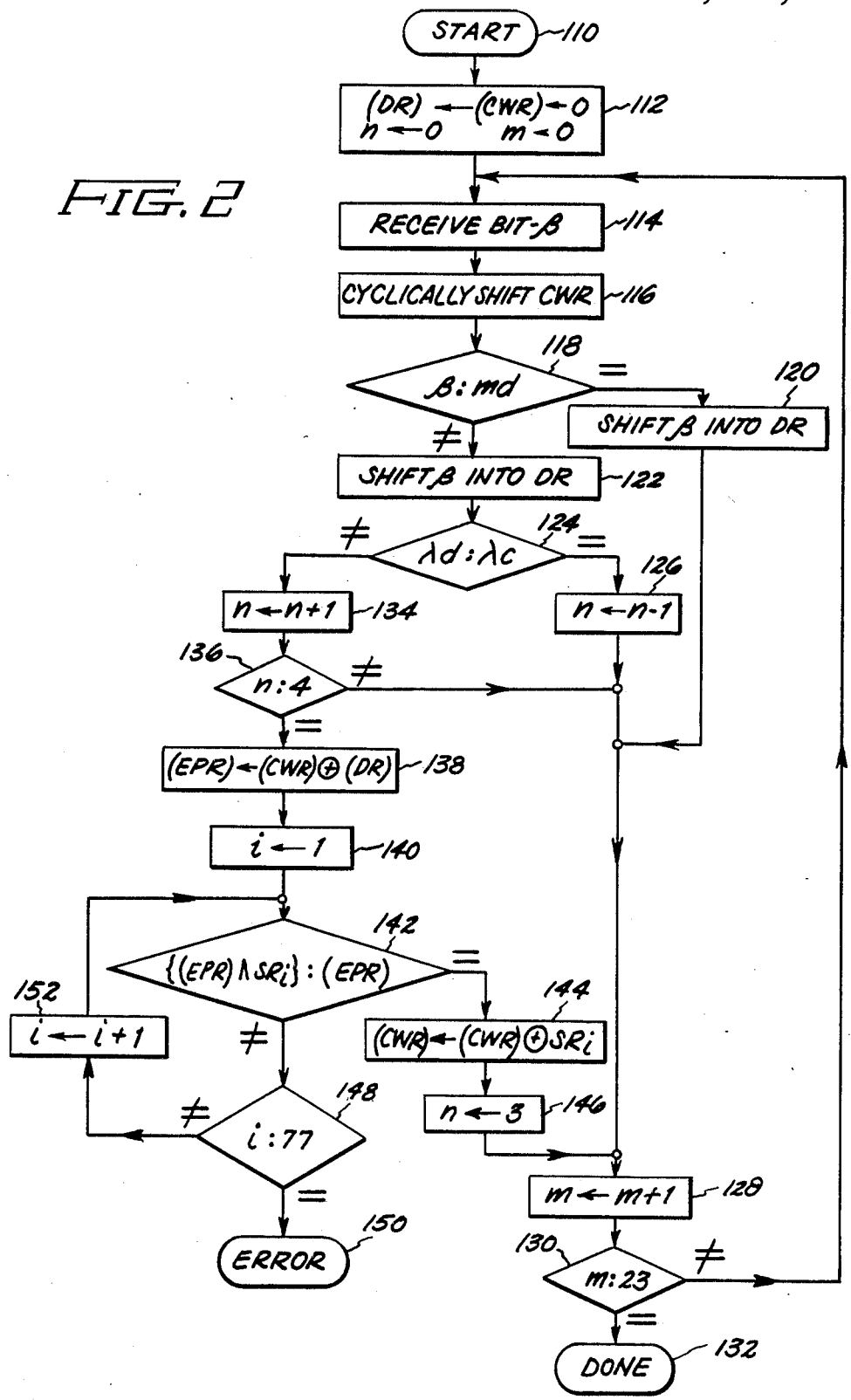
FIG. 2 is a flow diagram of a method of the present invention.

Referring to FIG. 2, a flow diagram for performing tracking decoding in accordance with a method of the present invention is shown. The method begins at start step 110 and then proceeds to execute initialization step 112. Execution of step 112 sets the contents of code word register (CWR) 12 (FIG. 1), contents of data register (DR) 14 (FIG. 1) and variables m and n (contents of bit counter (BC) 18 (FIG. 1) and Hamming distance counter (HDC) 20 (FIG. 1), respectively) to zero. Step 114 is performed as each bit $\beta$ of the message word is received and execution of step 116 cyclically shifts the code word register one bit position as hereinabove explained. Performance of step 118 compares the logical value of received bit $\beta$ with the logical value of the most significant bit md of DR 14 (FIG. 1). If the logical value of $\beta$ is equal to the logical value of md, step 120 is performed to shift $\beta$ into DR 14 (FIG. 1) and thereby shift bit md out of DR 14. Execution of step 128 adds one to the contents m of BC 18 (FIG. 1) and stores the sum as the new contents of BC 18. Execution of step 130 compares the value of m with 23, (the total number of bits in a Golay (23,12) message word) and the program proceeds to execute step 132 if the value of m is equal to 23 indicating all 23 bits of the code word have been decoded. If the value of m is not equal to 23 when step 130 is performed, the program proceeds to step 114 and executes steps 114 through 130 as hereinbefore described.

If the logical value of received bit $\beta$ and the logical value md of the most significant bit of DR 14 (FIG. 1) are not equal when step 118 is performed, the program proceeds to execute step 122 which shifts received bit $\beta$ into DR 14 (FIG. 1). Execution of step 124 then compares the logical value of the least significant bit $\lambda d$ of DR 14 (FIG. 1) with the logical value of the least significant bit $\lambda c$ of CWR 12 (FIG. 1). If the logical value of $\lambda d$ equals the logical value of $\lambda c$, step 126 is performed to subtract one from contents n of HDC 20 (FIG. 1) and to store the difference in HDC 20. Steps 128 and 130 are then performed as hereinabove described.

If the logical value of $\lambda d$ is not equal to the logical value of $\lambda c$ when step 124 is performed, step 134 is performed to add one to the contents n of HDC 20 (FIG. 1) and to store the resulting sum in HDC 20. Execution of step 136 compares the value of n with four (i.e. one more than the maximum number of errors correctable by the code being used). If n is not equal to four, steps 128 and 130 are performed as hereinbefore described. If n is equal to four, step 138 is performed to exclusively OR the contents of CWR 12 (FIG. 1) with the contents of DR 14 (FIG. 1) and to store the result in EPR 16 (FIG. 1). Since a bit by bit comparison operation is being performed at step 124, the performance of step 138 will always generate a word having four logical ones,, with a logical one in the LSB position of EPR 16 (FIG. 1). The logical one in the LSB position occurs because the last bit comparison of step 124 will indicate an inequality in the logical bit values being compared. Execution of step 140 initializes the value of index i at one. Index i is used to identify the 77 patterns of Table I, each pattern corresponding to a unique index number i. Execution of step 142 logically ANDs the contents of EPR 16 (FIG. 1) with the value of a checking pattern code word $SR_i$ from Table I and compares the result with the contents of EPR 16. If the comparison of step 142 is not equal, step 148 is executed to compare the value of i with 77, the total number of checking pattern code words satisfying the aforementioned conditions. If i is not equal to 77, step 152 is performed to increment i by one and step 142, 148 and 152 are repeated as hereinabove described. If performance of step 148 determines that i is equal to 77, step 150 is executed to indicate that there exists an error in the received message word which is not correctable using the present technique.

If performance of step 142 determines that the comparison is equal, step 144 is executed to exclusively OR the contents of CWR 12 (FIG. 1) with the value $SR_i$ (determined by execution of step 142 to produce an equality) and to store the result in CWR 12. Execution of step 146 sets the value n of the contents of HDC 20 (FIG. 1) to three and steps 128 and 130 are performed as hereinabove described.

Since the contents of EPR 16 (FIG. 1) will be exactly four logical ones (i.e. one more than the maximum error correction capability of a Golay (23,12) code) with a logical one in the LSB position after step 138 is executed (and therefore when step 142 is performed), and since checking pattern code words $SR_i$ are selected to include all code words having seven logical ones (i.e. $2x+1$ wherein x is the maximum error correction capability of the linear cyclic block code being used) with a logical one in the LSB position, four of the logical ones from one and only one checking pattern code word $SR_i$ will occupy the same relative bit positions as do the four logical ones of the contents of EPR 16 (FIG. 1). Thus execution of step 144 ensures that the Hamming distance between the new contents of CWR 12 (FIG. 1) and the contents of DR 14 (FIG. 1) will be equal to the maximum error correction capability of a Golay (23,12) code, since four corresponding bit positions between the old contents of CWR 12 (FIG. 1) and the checking pattern code word as determined by the equality when step 142 is executed will be different, the logical values of these four bit positions for the new contents of CWR 12 (FIG. 1) after performing step 144 will be the same as the logical values for the corresponding four bit positions of the contents of DR 14 (FIG. 1).

A simulated example of transmission and reception of an encoded data word is illustrated in Table II. The data word to be transmitted is 1035 (decimal)=40B (hexadecimal). The data word is encoded using the polynominal g (x)= which yields a message word (i.e. encoded data word) of 205D14 (hexadecimal). The received message word is assumed to be 605594 (hexadecimal) (i.e. three bit errors from transmitted message word in bit positions 1, 12 and 16 with MSB being bit position 1). Table II shows the progression of the received message bits (i.e. contents of DR 14 (FIG. 1)) and corresponding contents of CWR 12 (FIG. 1) for each bit received. The contents of CWR 12 after reception of the twenty-third bit (i.e. 205D14 (hexadecimal)) represents the transmitted message word within the error correction capability of the tracking receiver in accordance with the present invention.

TABLE II

| BIT NUMBER | DATA RECEIVED | CWR CONTENTS | DIFFERENCE (EPR) | HAMMING DISTANCE |
|---|---|---|---|---|
| 1 | 1 | 0 | 1 | 1 |
| 2 | 3 | 0 | 3 | 2 |
| 3 | 6 | 0 | 6 | 2 |
| 4 | C | 0 | C | 2 |
| 5 | 18 | 0 | 18 | 2 |
| 6 | 30 | 0 | 30 | 2 |
| 7 | 60 | 0 | 60 | 2 |
| 8 | C0 | 0 | C0 | 2 |
| 9 | 181 | 0 | 181 | 3 |
| 10 | 302 | 0 | 302 | 3 |
| 11 | 605 | 108607 | 108002 | 3 |
| 12 | C0A | 210C0E | 210004 | 3 |
| 13 | 1815 | 103A15 | 102200 | 3 |
| 14 | 302A | 20742A | 204400 | 3 |
| 15 | 6055 | 46245 | 40210 | 3 |
| 16 | C0AB | 1D0A9 | 11002 | 3 |
| 17 | 18156 | 3A152 | 22004 | 3 |
| 18 | 302AC | 742A4 | 44008 | 3 |
| 19 | 60559 | 6555D | 5004 | 3 |
| 20 | C0AB2 | CAABA | A008 | 3 |
| 21 | 181565 | 81745 | 100220 | 3 |
| 22 | 302ACA | 102E8A | 200440 | 3 |
| 23 | 605594 | 205D14 | 400880 | 3 |

Although the apparatus and method have been illustrated using a Golay (23,12) and an extended Golay (24,12) code, the techniques exemplified herein are not so limited. These techniques may be readily applied by one skilled in the art to generate a tracking receiver and method of decoding for any linear cyclic block error correction code. Also, these techniques are applicable to situations in which the LSB of the message word is transmitted first.

Thus has been illustrated and described a method and apparatus for reducing the time required for decoding linear cyclic block codes. Further, the apparatus and method of the present invention may begin decoding a partially received string of information bits of a message word before the entire message word is received, without need of expensive hardware.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. A tracking decoder for decoding a received message word into data word which has been encoded to form a first linear cyclic block code word including said data word and a parity word, comprising:
   control means;
   memory means coupled to said control means for storing a plurality of predetermined second linear cyclic block code words;
   code word means coupled to said control means for storing a cyclicly shifting a selected one of said plurality of predetermined second linear cyclic block code words;
   data means coupled to said control means for serially sequentially examining each bit of said received message word;
   Hamming means coupled to said control means for storing the Hamming distance between the contents of said code word means and contents of said data means; and
   scratch pad means coupled to said control means;
   said control means operative to monitor continuously the Hamming distance between the contents of said code word means and said data means and store the said distance in said Hamming means, and when said Hamming distance is above a predetermined value, to logically exclusively OR the contents of said code word means and the contents of said data means and store the logical result of the ORing process in said scratch pad means, said control means operating in response to the contents of said Hamming means above a predetermined value and the contents of said scratch pad means to update said code word means to a code word corresponding to the contents of said data means, the contents of said code word means, after the receipt of said message word, being decoded by said control means to retrieve said data word.

2. The decoder as in claim 1 wherein each of said code word means, said data means and said scratch pad means comprises a register.

3. The decoder as in claim 1 wherein said control means comprises a general purpose microprocessor programmed to select a different one of said plurality of predetermined second linear cyclic block code words for said code word means when said Hamming means stores a Hamming distance greater than the maximum bit error correction capability of said first linear cyclic block code word.

4. The decoder as in claim 3 wherein said data word is encoded to form a Golay (23,12) code word, whereby the maximum bit error correction capability of said first linear cyclic block code word is 3.

5. A method for decoding a data word from a first binary message word, said first message word having been encoded to form a first linear cyclic block code word including said data word and a parity word, wherein fewer than a first predetermined number of bits of said first binary message word may have been corrupted after encoding, comprising:
   (a) cyclicly shifting one bit of a predetermined second linear block code word one bit position, said second linear block code word consisting of the same number of bits as said first message word;
   (b) logically comparing the first bit of said first message word with the first bit of a predetermined second binary message word;
   (c) repeating steps a and b for each next respective sequential bit of said first and second message word, respectively, when comparison of step b determines that the respective bits of said first and second message word are logically equivalent;
   (d) logically comparing the immediately preceding bit having been cyclicly shifted with the respective bit of said first message word when comparison of step b determines that the respective bits of said first and second message word are not logically equivalent;

(e) decreasing a second predetermined number by one when comparison of step d determines that the immediately preceding bit having been cyclicly shifted is logically equivalent to the respective bit of said first message word;

(f) increasing said second predetermined number by one when comparison of step d determines that the immediately preceding bit having been cyclically shifted is not logically equivalent to the respective bit of said first message word;

(g) comparing said second predetermined number with said first predetermined number and repeating steps a through f for each next respective sequential bit of said first and second message word, respectively, when comparison determines that said second predetermined number is less than said first predetermined number;

(h) exclusively ORing the present status of said second linear block code word with the respective sequence of bits of said first message word having already been compared by execution of step b when comparison of step g determines that said second predetermined number is equal to said first predetermined number;

(i) logically ANDing the result of step h with a plurality of predetermined third linear block code words;

(j) comparing the result of step h with the respective one of the plurality of third linear block code words having generated the result of step i;

(k) exclusively ORing the present status of said second linear block code word with the respective one of the plurality of third linear block code words having generated an equality for step j;

(l) substituting the result of step k for the present status of said second linear block code word; and (m) repeating steps a through l until a third predetermined number of bits of said first message word have been examined.

6. The method as in claim 5, wherein said plurality of third linear block code words comprises words including a logical one in the least significant bit position and a total number of logical ones equal to one plus twice said second predetermined number.

7. The method as in claim 5, wherein said linear cyclic block code word comprises a Golay (23, 12) code word and said first predetermined number is 4 said second predetermined number is 3 and said third predetermined number is 23.

8. The method as in claim 5, further comprising obtaining the data word from the present status of said second linear block code word after said third predetermined number of bits of said first message word have been examined.

9. A method for decoding a data word from an extended Golay (24,12) code word, said extended Golay code word having been encoded to include said data word, a parity word and an overall parity bit, wherein fewer than a first predetermined number of bits of said first binary message word may have been corrupted after encoding, comprising:

(a) cyclicly shifting one bit of a predetermined first linear block code word one bit position, said first linear block code word consisting of one less than the number of bits of said extended Golay code word;

(b) logically comparing the first bit of said extended Golay code word with the first bit of a predetermined binary message word;

(c) repeating steps a and b for each next respective sequential bit of said extended Golay code word and binary message word, respectively, when comparison of step b determines that the respective bits of said extended Golay code word and binary message word are logically equivalent;

(d) logically comparing the immediately preceding bit having been cyclicly shifted with the respective bit of said extended Golay code word when comparison of step b determines that the respective bits of said extended Golay code word and said binary message word are not logically equivalent;

(e) decreasing a second predetermined number by one when comparison of step d determines that the immediately preceding bit having been cyclicly shifted is logically equivalent to the respective bit of said extended Golay code word;

(f) increasing said second predetermined number by one when comparison of step d determines that the immediately preceding bit having been cyclicly shifted is not logically equivalent to the respective bit of said extended Golay code word;

(g) comparing said second predetermined number with said first predetermined number and repeating steps a through f for each next respective sequential bit of said extended Golay code word and said binary message word, respectively, when comparison determines that said second predetermined number is less than said first predetermined number;

(h) exclusively ORing the present status of said first linear block code word with the respective sequence of bits of said extended Golay code word having already been compared by execution of step b when comparison of step g determines that said second predetermined number is equal to said first predetermined number;

(i) logically ANDing the result of step h with a plurality of a predetermined second linear block code word;

(j) comparing the result of step i with the respective one of the plurality of second linear block code words having generated the result of step i;

(k) exclusively ORing the present status of said first linear block code word with the respective one of the plurality of second linear block code words having generated an equality for step j;

(l) substituting the result of step k for the present status of said first linear block code word; and (m) repeating steps a through l until a predetermined number of bits of said extended Golay code word have been examined.

10. The method as in claim 9, wherein said plurality of second linear block code words comprises words including a logical one in the least significant bit position and a total number of logical ones equal to one plus twice said second predetermined number.

11. The method as in claim 9 further comprising, exclusively ORing the present status of said first linear block code word with said extended Golay code word excluding the overall parity bit to generate a Hamming distance check result, after said predetermined number of bits of said extended Golay code word have been examined.

12. The method as in claim 11 further comprising, obtaining the data word from the present status of said first linear block code word when said Hamming distance check result includes less than three logical ones.

13. The method as in claim 11 further comprising, checking parity of said extended Golay code word with the overall parity bit when said Hamming distance check result includes exactly three logical ones and obtaining the data word from the present status of said first linear block code word when the parity check indicates a correct parity.

14. The method as in claim 11 further comprising, checking parity of said extended Golay code word with the overall parity bit when said Hamming distance check result includes exactly three logical ones and indicating an uncorrectable error in said extended Golay code word when the parity check indicates an incorrect parity.

15. A method of decoding a data word from a received binary message word, said received binary message word being associated with a transmitted code word of a linear cyclic block code, said transmitted code word including said data word and a parity word comprising the steps of:
  (a) forming a data word, a poriton of said data word corresponding to previously received bits of said received binary message word;
  (b) changing said data word in accordance with newly received bits of said received message word;
  (c) generating a code word of said linear cyclic block code which continuously corresponds to said current data word by being within a Hamming distance equal to or less than the maximum error correction capability of said code; and
  (d) extracting the data word associated with the code word corresponding to a fully received message word.

16. A method of decoding a data word from a received binary message word, said received binary message word being associated with a transmitted code word of a linear cyclic block code, said transmitted code word including said data word and a parity word comprising the steps of:
  (a) generating in a first storage means a data word having a number of bits corresponding to the number of bits in the code words of said code;
  (b) generating in a second storage means a code word corresponding to said data word, said code word being a Hamming distance from said data word which is within the error correction capability of said code;
  (c) storing said Hamming distance in a third storage means;
  (d) changing said data word in accordance with serially sequentially received bits of said received message word;
  (e) changing said code word as needed to continuously be within a Hamming distance no greater than the error correction capability of the code; and
  (f) extracting the data word associated with the code word contained in the second storage means when the received message word has been fully examined.

* * * * *